(12) United States Patent
Ahn et al.

(10) Patent No.: US 9,099,630 B2
(45) Date of Patent: Aug. 4, 2015

(54) ELECTRONIC APPARATUS

(71) Applicant: SAMSUNG ELECTRONICS CO., LTD., Suwon-si, Gyeonggi-do (KR)

(72) Inventors: Sung Oh Ahn, Suwon-si (KR); Jin Se Kim, Seoul (KR); Chang Ho Shin, Incheon (KR); Seok Chan Hong, Seongnam-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 33 days.

(21) Appl. No.: 14/042,123

(22) Filed: Sep. 30, 2013

(65) Prior Publication Data
US 2014/0217456 A1 Aug. 7, 2014

(30) Foreign Application Priority Data

Feb. 5, 2013 (KR) .......................... 10-2013-0013063

(51) Int. Cl.
H01L 33/38 (2010.01)
H01L 33/62 (2010.01)
H05K 1/11 (2006.01)
H01L 33/48 (2010.01)
H05K 3/34 (2006.01)

(52) U.S. Cl.
CPC ............... *H01L 33/62* (2013.01); *H05K 1/111* (2013.01); *H01L 33/486* (2013.01); *H01L 2224/48091* (2013.01); *H05K 3/3431* (2013.01); *H05K 3/3442* (2013.01); *H05K 2201/09381* (2013.01); *H05K 2201/09663* (2013.01); *H05K 2201/10106* (2013.01)

(58) Field of Classification Search
CPC ................. H01L 2224/48091; H01L 2224/97; H01L 2224/83192; H01L 2224/45015; H01L 2224/05572; H01L 2224/05017; H01L 2224/05555; H01L 2224/05557; H01L 23/3128; H01L 21/563; H01L 24/06; H01L 24/97; H01L 25/0652; H01L 33/20; H01L 33/38

See application file for complete search history.

(56) References Cited

U.S. PATENT DOCUMENTS

| 5,604,379 | A  | * | 2/1997 | Mori ............................. 257/738 |
| 5,616,520 | A  | * | 4/1997 | Nishiuma et al. ............. 438/125 |
| 5,628,919 | A  | * | 5/1997 | Tomura et al. .................. 216/18 |
| 6,060,775 | A  | * | 5/2000 | Ano ............................. 257/693 |
| 6,245,582 | B1 | * | 6/2001 | Yamaguchi et al. ............ 438/14 |
| 6,266,120 | B1 | * | 7/2001 | Han ............................. 349/150 |
| 6,587,008 | B2 | * | 7/2003 | Hatanaka et al. ............... 331/68 |
| 6,613,610 | B2 | * | 9/2003 | Iwafuchi et al. .............. 438/128 |

(Continued)

FOREIGN PATENT DOCUMENTS

| JP | 06-140752 | 5/1994 |
| JP | 08-088447 | 4/1996 |

(Continued)

*Primary Examiner* — Evan Pert
*Assistant Examiner* — Gustavo Ramallo
(74) *Attorney, Agent, or Firm* — McDermott Will & Emery LLP

(57) ABSTRACT

The present application provides an electronic apparatus including a substrate including a first electrode pad, a second electrode pad and an intermediate pad each disposed on one surface of the substrate and separated from one another. An electronic device is disposed on the substrate and including a first electrode unit and a second electrode unit. The first electrode unit has an adhesion surface facing the first electrode pad and the intermediate pad. The second electrode unit has an adhesion surface facing the second electrode pad.

15 Claims, 9 Drawing Sheets

(56) References Cited

U.S. PATENT DOCUMENTS

| | | | |
|---|---|---|---|
| 6,854,901 B1 * | 2/2005 | Ouchi | 385/89 |
| 7,332,758 B2 * | 2/2008 | Yamabi et al. | 257/292 |
| 7,615,858 B2 * | 11/2009 | Eun | 257/686 |
| 8,237,270 B2 * | 8/2012 | Kobayashi et al. | 257/736 |
| 8,395,260 B2 * | 3/2013 | Matsuki et al. | 257/737 |
| 8,614,544 B2 * | 12/2013 | Suzuki et al. | 313/326 |
| 8,890,186 B2 * | 11/2014 | Ogata et al. | 257/98 |
| 2002/0001997 A1 * | 1/2002 | Reul | 439/422 |
| 2005/0156187 A1 * | 7/2005 | Isokawa et al. | 257/100 |
| 2005/0275093 A1 * | 12/2005 | Noma | 257/734 |
| 2007/0235215 A1 * | 10/2007 | Bathan et al. | 174/260 |
| 2010/0295177 A1 * | 11/2010 | Ouchi | 257/737 |
| 2012/0112622 A1 * | 5/2012 | Suzuki et al. | 313/326 |
| 2012/0138982 A1 * | 6/2012 | Chen et al. | 257/98 |

FOREIGN PATENT DOCUMENTS

| | | |
|---|---|---|
| JP | 2002-223062 A | 8/2002 |
| JP | 2002-261430 A | 9/2002 |
| KR | 10-1999-0042507 | 6/1999 |
| KR | 20-0183623 | 3/2000 |
| KR | 10-2004-0089459 | 10/2004 |
| KR | 20-0368151 | 11/2004 |
| KR | 10-0827688 B1 | 5/2008 |
| KR | 10-2012-0048535 A | 5/2012 |

* cited by examiner

ELECTRONIC APPARATUS

CROSS-REFERENCE TO RELATED APPLICATION

This application claims priority to Korean Patent Application No. 10-2013-0013063, filed on Feb. 5, 2013 in the Korean Intellectual Property Office, the disclosure of which is incorporated herein by reference in its entirety.

TECHNICAL FIELD

Aspects of embodiments relate to an electronic apparatus.

BACKGROUND

Printed circuit boards (PCBs) for use in the mounting of electronic devices may have a predetermined form serving to simply connect a plurality of electronic device products to one another. PCBs are components in widespread use in apparatuses from electronic appliances to high-tech communications devices, as well as in digital television sets. Meanwhile, when electronic devices such as light emitting device packages or the like are soldering-mounted on PCBs, there may be a problem such as a lack of solder, or the mounting of electronic devices may not be uniform in terms of bonding to PCBs after a mounting process. These factors may hinder the reliability and stability of electronic devices.

SUMMARY

An aspect of an embodiment provides a scheme for improving reliability and stability at the time of bonding an electronic device to a substrate.

According to an aspect of the inventive concept, there is provided an electronic apparatus including: a substrate including a first electrode pad, a second electrode pad and an intermediate pad disposed on one surface thereof to be separated from one another; and an electronic device disposed on the substrate and including a first electrode unit and a second electrode unit, the first electrode unit having an adhesion surface facing the first electrode pad and the intermediate pad, and the second electrode unit having an adhesion surface facing the second electrode pad.

At least one of the first electrode pad and the second electrode pad may further include at least one concave-convex part disposed on an outer circumferential surface thereof.

In this case, the concave-convex part may be disposed in a surface adjacent to an outer side part of the electronic device on the outer circumferential surface.

The intermediate pad may be disposed between the first electrode pad and the second electrode pad.

The first and second electrode pads may be disposed without being entirely covered by the first and second electrode units, such that an exposed region is provided, when the substrate having the electronic device disposed thereon is viewed from above.

At least one of the first and second electrode pads may have a shape at least partially corresponding to the adhesion surfaces of the first and second electrode units.

The adhesion surface of the first electrode unit may be larger than that of the second electrode unit.

The sum of an area of the first electrode pad and an area of the intermediate pad may be larger than an area of the second electrode pad.

The electronic apparatus may further include at least one ledge part connecting the first electrode pad to the intermediate pad.

A side part of an outer circumferential surface of the first electrode pad facing the intermediate pad may have a linear form.

At least one of the first and second electrode pads may include a shape centrally recessed from one side portion.

The electronic device may be a light emitting device package.

According to an aspect of the inventive concept, there is provided an electronic apparatus including: a substrate including a first electrode pad and a second electrode pad disposed on one surface thereof to be separated from each other; and an electronic device disposed on the substrate and including first and second electrode units having adhesion surfaces facing the first electrode pad and the second electrode pad, respectively, wherein at least one of the first and second electrode pads includes at least one concave-convex part formed on an outer circumferential surface thereof.

The concave-convex part may be disposed in a region adjacently to an outer side part of the electronic device on the outer circumferential surface.

The first electrode pad may include first and second regions separated and spaced apart from each other.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION

Embodiments will now be described in detail with reference to the accompanying drawings.

Embodiments may, however, be embodied in many different forms and should not be construed as being limited to embodiments set forth herein. Rather, these embodiments are provided so that this disclosure will be thorough and complete, and will fully convey the scope of the inventive concept to those skilled in the art.

Figure 1:
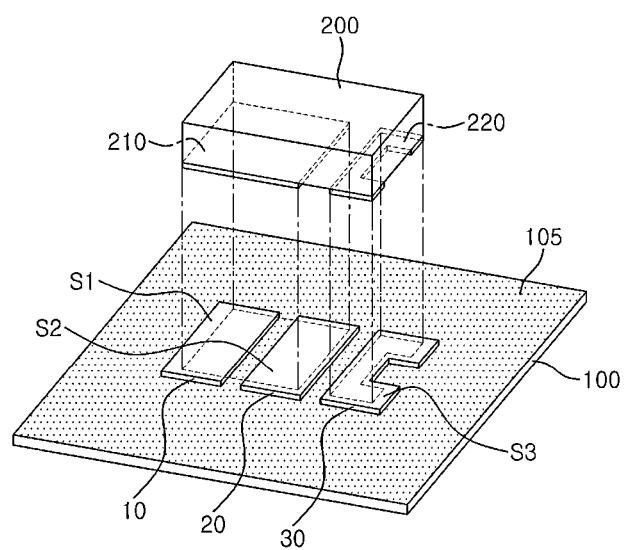
FIG. 1 is an exploded perspective view of an electronic apparatus according to an embodiment.

FIG. 1 is an exploded perspective view of an electronic apparatus according to an embodiment of the present inventive concept.

With reference to FIG. 1, an electronic apparatus according to an embodiment may include a substrate 100 having an upper surface on which a first electrode pad 10, a second electrode pad 30 and an intermediate pad 20 are disposed to be separated from one another, and an electronic device 200 disposed on the substrate 100 and including a first electrode unit 210 and a second electrode unit 220. Here, the first electrode unit 210 may have an adhesion surface facing the first electrode pad 10 and the intermediate pad 20, and the second electrode unit 220 may have an adhesion surface facing the second electrode pad 30.

The substrate 100 may be a base region configuring a circuit board on which an electronic device 200 is to be mounted, for example, a printed circuit board (PCB). The substrate 100 may be formed of a material such as FR-4, CEM-3, or the like, but is not limited thereto. For example, the substrate 100 may also be formed of glass, an epoxy material, a ceramic material, or the like. On the other hand, the substrate 100 may include an electrically insulating material due to contacting the first and second electrode pads 10 and 30.

The first electrode pad 10, the intermediate pad 20 and the second electrode pad 30 may be disposed on the upper surface of the substrate 100 to be separated from one another. The pads 10, 20 and 30 may be provided to apply power to the electronic device 200 disposed on the substrate 100. The pads 10, 20 and 30 may be formed of a conductive thin film, for example, copper foil.

As shown in dotted line portions of FIG. 1, the first electrode unit 210 of the electronic device 200 may be disposed on the first electrode pad 10 and the intermediate pad 20, and the second electrode unit 220 of the electronic device 200 may be disposed on the second electrode pad 30. Here, the first and second electrode pads 10 and 30 may be disposed without being entirely covered by the first and second electrode units 210 and 220 such that exposed regions thereof may be provided when the substrate 100 having the electronic device 200 disposed thereon is viewed from above. In this case, a fillet may be formed relatively more smoothly as described below.

The electronic device 200 may include the first electrode unit 210 and the second electrode unit 220 receiving external power from the first and second electrode pads 10 and 30 formed on the substrate 100. Here, surfaces of the first and second electrode units 210 and 220 facing the pads may be defined as adhesion surfaces. In this case, the adhesion surface of the first electrode unit 210 may be understood to face the first electrode pad 10 and the intermediate pad 20, and the adhesion surface of the second electrode unit 220 may be understood to face the second electrode pad 30.

Further, with reference to FIG. 1, the first and second electrode pads 10 and 30 may have shapes at least partially corresponding to the adhesion surfaces of the first and second electrode units 210 and 220. In detail, the adhesion surface of the first electrode unit 210 may have a rectangular shape, and the first electrode pad 10 faced thereto may have an external surface corresponding to the adhesion surface of the first electrode unit 210, that is, may at least partially include a rectangular shape. Likewise, the adhesion surface of the second electrode unit 220 may partially include a 'U' shape, and corresponding thereto, the second electrode pad 30 may have a shape recessed from one side to the center thereof. In addition, a side surface of an outer circumferential surface of the first electrode pad 10, facing the intermediate pad 20, may have a linear form, but should not be considered as being limited thereto.

The substrate 100 may include a protector 105 formed on a region of an upper surface thereof, other than a region on which the first electrode pad 10, the intermediate pad 20 and the second electrode pad 30 are formed. The protector 105 may be formed of an electrically insulating material to serve as a passivation layer for the substrate 100. In addition, when employing, as the electronic device 200, a light emitting device such as a light emitting device package or the like, since the protector 105 is formed of a material having a relatively high level of reflectivity, the protector 105 may function as a light reflector. As an example of a material suitable for such protective and reflective functions, a photo solder resist (PSR) may be used.

In the present embodiment, in bonding the electronic device 200 to the substrate 100 by soldering, a fillet may be formed relatively smoothly, and reliability and the stability of electronic apparatuses may be increased. A detailed description thereof will be provided below with reference to FIGS. 3 to 6, and hereinafter, an example of the electronic device 200 applied to the present embodiment will first be described.

Figure 2A:
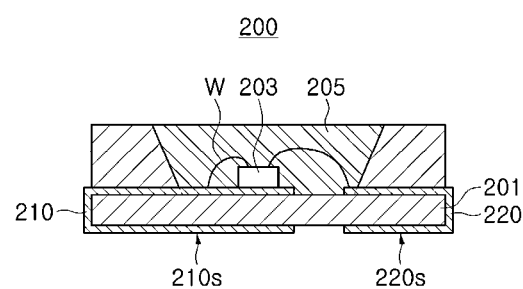
FIGS. 2A and 2B illustrate examples of an electrode device according to embodiments.
Figure 2B:
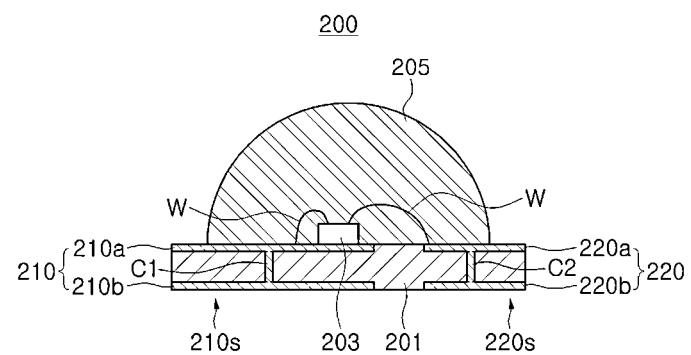

FIGS. 2A and 2B illustrate examples of the electrode device 200 according to embodiments.

With reference to FIG. 2A, the electronic device 200 according to the present embodiment may be a light emitting device package including a package body 201 including a light emitting device 203 and a cavity receiving the light emitting device 203 therein, and an encapsulant 205 provided in the cavity.

As the light emitting device 203, any photoelectric device able to emit light when an electrical signal is applied thereto may be used, and as an example thereof, a semiconductor light emitting device obtained by epitaxially growing a semiconductor layer on a growth substrate may be used. For example, the light emitting device may include an n-type semiconductor layer and a p-type semiconductor layer, and an active layer interposed therebetween, but should not be considered as being limited thereto. In addition, the active layer may be configured of a nitride semiconductor having a single or multiple quantum well (MQW) structure represented by $In_xAl_yGa_{1-x-y}N$ ($0 \leq x \leq 1$, $0 \leq y \leq 1$, $x+y \leq 1$).

The package body 201 may include the cavity receiving the light emitting device 203 therein, and the first and second electrode units 210 and 220. The package body 201 may be molded using a resin that is opaque or has a relatively high level of reflectivity and may also be molded using a polymer resin suitable for an injection molding process, but is not limited thereto. That is, the package body 201 may be formed using various materials, for example, a nonconductive material.

In the present embodiment, the first and second electrode units 210 and 220 may be electrically connected to an external electrode pad to receive external power. In this case, surfaces of the first and second electrode units 210 and 220 disposed to face electrode pads, more specifically, surfaces thereof contacting the electrode pads may be respectively defined as adhesion surfaces 210s and 220s of the first and second electrode units 210 and 220.

The first and second electrode units 210 and 220 may be electrically connected to the light emitting device 203 using a conductive wire W, and the light emitting device 203 may be mounted on the first electrode unit 210. In this case, the first electrode unit 210 having the light emitting device 203 disposed thereon serving as a relatively large heat radiation source. That is, the first electrode unit 210 may occupy an area larger than that of the second electrode unit 220, and correspondingly thereto, the adhesion surface 210s of the first electrode unit may be larger than the adhesion surface 220s of the second electrode unit.

In this case, as shown in FIG. 1, the sum of an area S1 of the first electrode pad 10 and an area S2 of the intermediate pad 20 facing the adhesion surface of the first electrode unit 210 may be larger than an area S3 of the second electrode pad 30 facing the adhesion surface of the second electrode unit 220.

The encapsulant 205 provided in the cavity may be formed of a light transmitting resin such as silicone or epoxy, and may include a wavelength conversion material excited by light emitted from the light emitting device 203 to emit light having different wavelengths. In this case, the wavelength conversion material may be at least one of a phosphor and a quantum dot.

FIG. 2B illustrates another type of electrode device 200 according to an embodiment by way of example. In detail, with reference to FIG. 2B, the electronic device 200 according to an embodiment may be a light emitting device package including a light emitting device 203, a package body 201 having first and second electrode units 210 and 220 disposed thereon, and an encapsulant 205 for covering the light emitting device 203.

According to the present embodiment, the first and second electrode units 210 and 220 may include first and second front electrodes 210a and 220a formed on an upper surface of a package body 201, first and second rear electrodes 210b and 220b formed on a lower surface of the package body 201 and receiving external power, and first and second conductive vias c1 and c2 connecting the front electrodes to the rear electrodes. Here, the first and second rear electrodes 210b and 22b may be electrically connected to an external electrode pad, and in this case, lower surfaces of the first and second rear electrodes may be understood to be adhesion surfaces 210s and 220s of the first and second electrode units 210 and 220.

The light emitting device 203 may be mounted on the first front electrode 210a, and the first front electrode 210a and the first rear electrode 210b corresponding thereto may be larger than the second front electrode 220a and the second rear electrode 220b, respectively, in consideration of heat radiation. In addition, in this case, the sum of areas S1 and S2 of the first electrode pad 10 and the intermediate pad 20, facing the adhesion surface 210s of the first electrode unit 210, may be larger than an area S3 of the second electrode pad 30 facing the adhesion surface 220s of the second electrode unit 220.

An electronic apparatus according to an embodiment will be described in more detail with reference to FIGS. 3 to 6.

FIGS. 3 to 6 schematically illustrate a process of manufacturing an electronic apparatus according to an embodiment.

Figure 3:
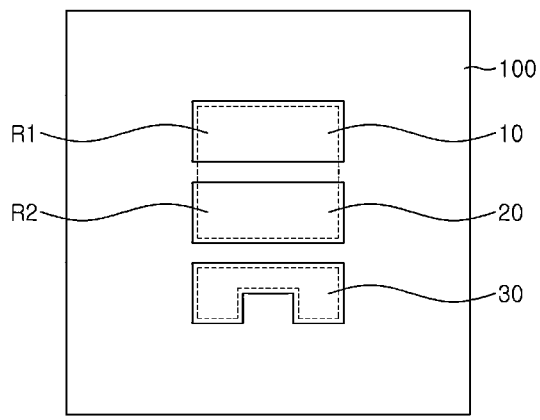
FIGS. 3 to 6 schematically illustrate a process of manufacturing an electronic apparatus according to an embodiment.

First, referring to FIG. 3, the first electrode pad 10, the intermediate pad 20 and the second electrode pad 30 may be disposed on the substrate 100 to be separated from one another. Here, for the sake of clearer understanding, regions in which the first and second electrode units 210 and 220 of the electronic device 200 are to be seated are represented as dotted-line portions in FIG. 3. The pads 10, and 30 may be formed in a conductive thin film form manner, and, for example, may be formed of copper foil.

In the present embodiment, the intermediate pad 20 may be disposed between the first and second electrode pads 10 and 30. The three pads 10, 20 and 30 may be formed by separate patterning, but unlike this case, the first electrode pad 10 and the intermediate pad 20 may also be formed by partially etching a single base pad. That is, in this case, the first electrode pad 10 and the intermediate pad 20 may be understood to be formed in a manner in which one first electrode pad corresponding to the first electrode unit 210 provided with the electronic device 200 is divided into first and second regions R1 and R2 that are spaced apart from each other.

Figure 4:
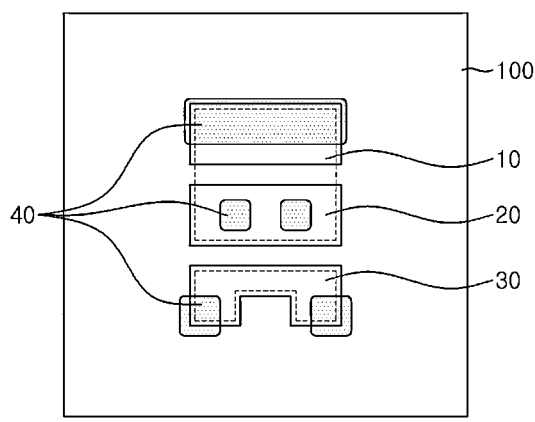

Subsequently, as shown in FIG. 4, solder paste/cream 40 may be applied on regions on which the first electrode pad 10, the intermediate pad 20 and the second electrode pad 30 are respectively formed, using a coating process such as screen printing or the like. As shown in FIG. 4, the solder paste/cream 40 applied to the region on which the intermediate pad 20 is formed may be coated on an inner surface side of the region on which the intermediate pad 20 is disposed, and the solder paste/cream 40 formed on the respective regions on which the first and second electrode pads 10 and 30 are formed may be coated on portions of outer circumferential surfaces of the electrode pads, but should not be considered to be limited thereto.

Figure 5:
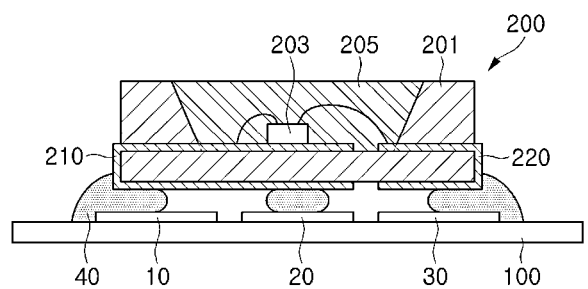

As shown in FIG. 5, the electronic device 200 may be mounted on the substrate 100. FIG. 5 is a side cross-sectional view of the substrate 100 in a state in which the present embodiment is completed as viewed from a lateral side thereof.

In the present embodiment, it can be understood that as the electronic device 200, the light emitting device package shown in FIG. 2A is employed, and the first electrode unit 210 is mounted to face the first electrode pad 10 and the intermediate pad 20, and the second electrode unit 220 is mounted to face the second electrode pad 30.

Next, a reflow process may be performed by applying heat such that the solder paste/cream 40 is melted to allow the electronic device 200 to be bonded to the substrate 100.

Figure 6:
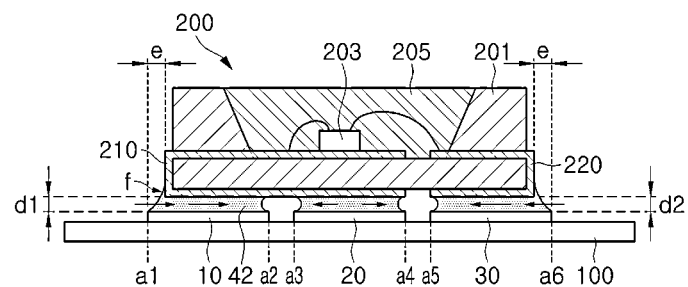

FIG. 6 is a side cross-sectional view of the substrate 100 in a state in which the present process is completed as viewed from a lateral side thereof.

In the present process, a molten solder 42 in the reflow process may have a relatively high degree of bonding force to be bonded to a metal and may thus be introduced to between the electrode pads 10, 20 and 30 of the substrate 100 and the electrode units 210 and 220 of the electronic device 200. In detail, the solder paste/cream 40 formed on the first electrode pad 10 may be melted and introduced to a side portion a2 of the first electrode pad 10 facing the intermediate pad 20 among outer circumferential surfaces of the first electrode pad 10 and a flow thereof may then be stopped such that remaining solder may form a fillet f, together with an outer circumferential surface of the first electrode unit 210 adjacent to an outer circumferential surface a1 of the first electrode pad 10. Here, in order to facilitate the formation of the fillet f, the first electrode pad 10 may be formed without being covered by the first electrode unit 210 such that an exposed region e is provided when viewing the substrate 100 on which the electronic device 200 is disposed, from above.

In addition, the solder paste/cream 40 formed on the intermediate pad 20 may be melted and introduced to outer circumferential surfaces a3 and a4 of the intermediate pad 20 and a flow thereof may then be stopped, and the solder paste/cream 40 formed on the second electrode pad 30 may be melted and introduced to an outer circumferential surface a5 thereof facing the intermediate pad 20 and a flow thereof may then be stopped. Remaining solder thereof may form a fillet f together with an outer circumferential surface of the second electrode unit 220 adjacent to an outer circumferential surface a6 of the second electrode pad 20.

In the present embodiment, in the electronic device 200, an adhesion surface of the first electrode unit 210 on which the light emitting device 203 is mounted may be larger than that of the second electrode unit 220 in consideration of a heat radiation effect. An electrode pad contacting the first electrode unit 210 may be divided into the first electrode pad 10 and the intermediate pad 20, thereby preventing the occurrence of a phenomenon in which the molten solder 42 is collected on an inner surface side of the electrode pad. Therefore, a problem such as a lack of solder or the like, for example, a lack of remaining solder in forming a fillet on an outer circumferential surface of an electrode pad, may be effectively improved. In addition, in the present embodiment, since the molten solder 42 may be evenly formed on respective pads, a problem in which solder is collected on an inner surface side of the pad due to surface tension thereof, that is, a problem in mounting heights due to a difference in thicknesses of solder in steps d1 and d2, may be effectively improved.

Figure 7A:
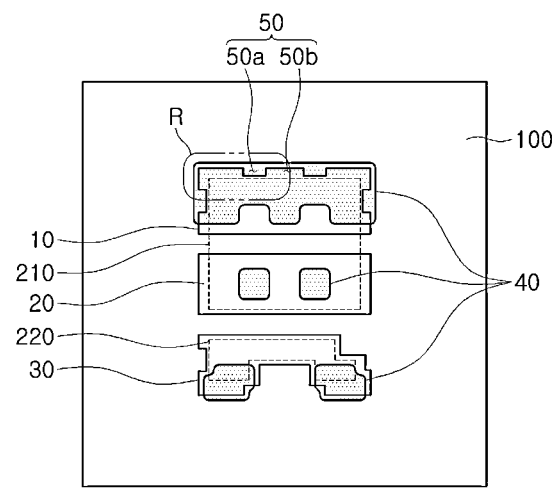
FIGS. 7A and 7B illustrate a substrate used in an electronic apparatus according to an embodiment.
Figure 7B:
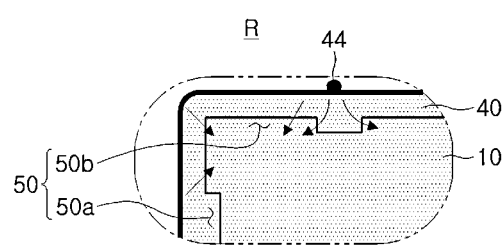

FIGS. 7A and 7B are a top view of a substrate 100 used in an electronic apparatus according to another embodiment and an enlarged view illustrating region R shown in FIG. 7A, respectively.

With reference to FIG. 7A, the substrate 100 used in an electronic apparatus according to the embodiment may include a first electrode pad 10 and a second electrode pad 30 disposed to be separated from each other on an upper surface of the substrate 100, and may further include an intermediate pad 20 disposed between the first and second electrode pads 10 and 30 to be spaced apart from each other. Here, for the sake of a clearer understanding, regions in which first and second electrode units 210 and 220 of an electronic device 200 are to be disposed are represented by dotted lines, and solder paste/cream 40 applied on the first and second electrode pads 10 and 30 and the intermediate pad 20 is shown, in FIGS. 7A and 7B.

In particular, in the present embodiment, at least one of the first and second electrode pads 10 and 30 may include at least one concave-convex part 50 formed in an outer circumferential surface thereof. The concave-convex part 50 may be obtained by forming at least one of a groove 50a and a protrusion 50b in a portion of an outer circumferential surface of the electrode pad. In the present embodiment, the concave-convex part 50 may be formed in a region adjacent to an outer side part of the electronic device 200 among outer circumferential surfaces of the first and second electrode pads 10 and 30, but should not be considered to be limited thereto.

The concave-convex part 50 will be described in more detail with reference to FIG. 7B.

FIG. 7B is an enlarged view illustrating region R shown in FIG. 7A.

With reference to FIG. 7B, the solder paste/cream 40 applied on the electrode pads may be melted in a reflow process to be introduced to a region in which the electrode pad is formed, and in particular, may have a phenomenon in which the solder paste/cream 40 is collected on an inner surface side thereof among the region in which the electrode pad is formed, due to surface tension of solder. With regard to such a phenomenon in solder, in the present embodiment, an outer circumferential surface of the electrode pad may have the concave-convex part 50 formed thereon, thereby increasing a rate at which the molten solder remains on the outer circumferential surface.

In detail, a flow of the melted solder to be concentrated on the inner surface portion may be dispersed by the groove 50a, and thus, a rate at which the melted solder 42 remains on respective protrusions 50b formed on the outer circumferential surface may be increased. In addition, since the concave-convex part 50 may increase an area in which the melted solder contacts the outer circumferential surface, gravity for bonding to the outer circumferential surface of the electrode pad due to the surface tension of solder may be increased. As such, when an amount of solder remaining on the outer circumference of the electrode pad is increased, since the formation of a fillet between the electrode pad of the substrate 100 and the electrode unit of the electronic device 200 may be performed more smoothly, the reliability and stability of electronic apparatuses may be enhanced more effectively.

Subsequently, referring to FIG. 7B, a portion of the molten solder in the reflow process is not introduced to the region in which the electrode pad 10 is formed, but may be accumulated as a solder ball 44 on a region on which the electrode pad 10 is not formed among the upper surface of the substrate 100. The solder ball 44 deposition as described above may be a factor hindering stability of electronic apparatuses, such as a short-circuit in the electronic apparatuses. However, in the present embodiment, the molten solder may be effectively introduced to the electrode pad 10 formation region in the reflow process by the protrusion 50b of the concave-convex part 50 formed on the outer circumferential surface of the electrode pad 10, thereby reducing a depositional phenomenon in which the solder ball 44 is formed.

Figure 8A:
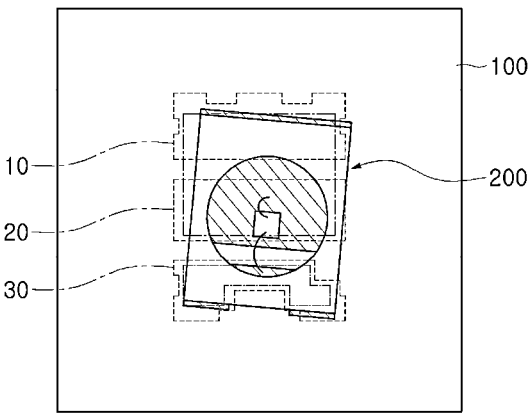
FIGS. 8A and 8B are top view of an electronic apparatus according to an embodiment and illustrate a characteristic according to the embodiment.
Figure 8B:
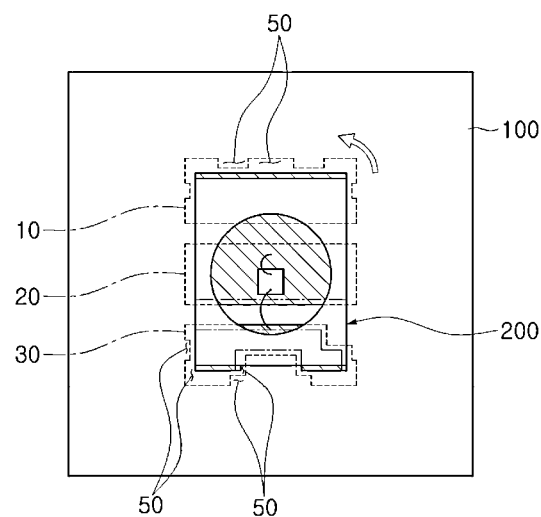

FIGS. 8A and 8B are top view of an electronic apparatus according to an embodiment and illustrate further characteristics in the present embodiment.

In disposing the electronic device 200 on the substrate, the first and second electrode units 210 and 220 of the electronic device may be matched with each other such that an area in which the first and second electrode units 210 and 220 are bonded to the pads 10, 20 and 30 formed on the substrate 100 may be relatively maximized, but as shown in FIG. 8A, the electronic device 200 may be mounted to deviate from a region as illustrated by a chain line due to a processing error or the like.

Then, when the solder paste/cream 40 formed on the electrode pad is melted in the reflow process, the molten solder may be introduced between the electrode pad 10, 20 and 30 of the substrate 100 and the electrode unit 210 and 220 of the electronic device 200. In this case, in the present embodiment, as shown in FIG. 8B, a mounting position of the electronic device 200 may be self-aligned such that an area in which the first and second electrode units 210 and 220 are bonded to the pads 10, 20 and 30 is relatively maximized due to surface tension of the molten solder.

In particular, in the present embodiment, the concave-convex part 50 formed on the circumferential surface is provided, such that a fillet between the electrode pads and the electrode units may be formed more smoothly, and in this case, an effect in which a mounting position of the electronic device 200 is self-aligned may be relatively more enhanced.

Figure 9A:
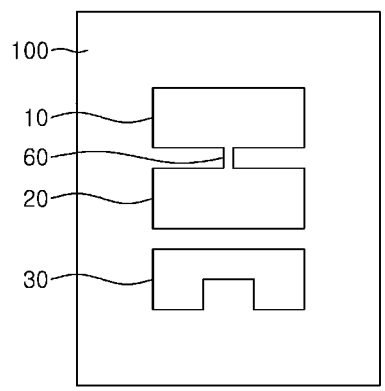
FIGS. 9A to 9C illustrate a substrate used in an electronic apparatus according to another embodiment.
Figure 9B:
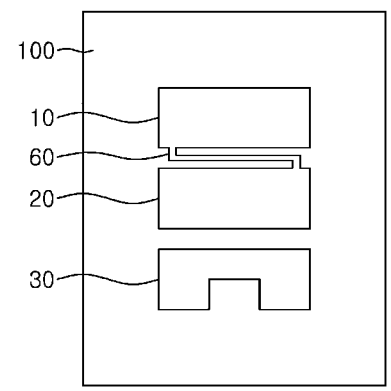
Figure 9C:
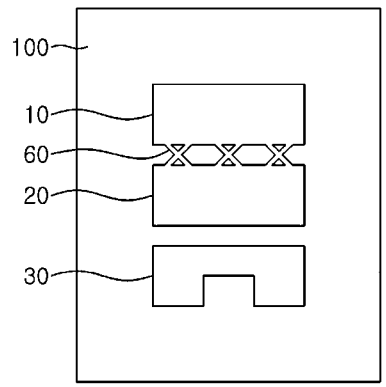

FIGS. 9A to 9C are top views illustrating a substrate used in an electronic apparatus according to another embodiment.

With reference to FIGS. 9A to 9C, a substrate 100 used in an electronic apparatus according to the present embodiment may include a first electrode pad 10, an intermediate pad 20 and a second electrode pad 30 formed on an upper surface of the substrate 100 to be separated from one another thereon.

On the other hand, the first electrode pad 10 and the intermediate pad 20 may only be disposed to decrease a phenomenon in which the molten solder in the reflow process is gathered on any one side or an inner surface portion of the electrode pad. That is, the first electrode pad 10 and the intermediate pad 20 may not necessarily be completely physically separated from each other. In the present embodiment, the substrate 100 may further include a ledge part 60 formed on an upper surface thereof connecting the first electrode pad 10 to the intermediate pad 20. The ledge part 60 may be provided as a single ledge part as shown in FIG. 9A, or may include a bent form as shown in FIG. 9B. In addition, as shown in FIG. 9C, the ledge part 60 may be provided in plural ledges while having a form intersected with other ledge parts 60.

The ledge part 60 as described above may prevent a phenomenon in which the molten solder in the reflow process is gathered on any one side, or specifically, may prevent a phenomenon of a lack of solder that may become a factor in which a fillet cannot be formed, while increasing a bonding area between the electrode units of the electronic device and the electrode pads such that a heat radiation effect may be enhanced.

FIGS. 10A to 10D are exploded perspective views of an electronic apparatus according to an embodiment and illustrate that electrode pads 10 and 30 and an intermediate pad 20 of a substrate 100 applied to an embodiment and electrode units 210 and 220 of an electronic device 200 may be differently varied in more detail, but should not be considered as being limited thereto, and thus, more variations and changes may be applied.

Figure 10A:
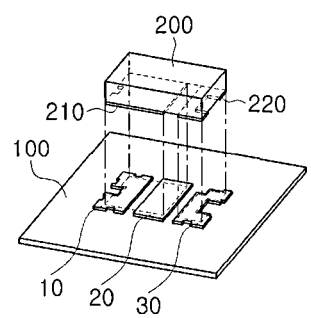
FIGS. 10A to 10D are exploded perspective views of an electronic apparatus according to another embodiment.

First, as shown in FIG. 10A, the first and second electrode units 210 and 220 provided with the electronic device 200 may have a shape centrally recessed from one side portion thereof, respectively, and the respect first and second electrode pads 10 and 30 may have a centrally recessed shape to correspond to those of the first and second electrode units 210 and 220.

Figure 10B:
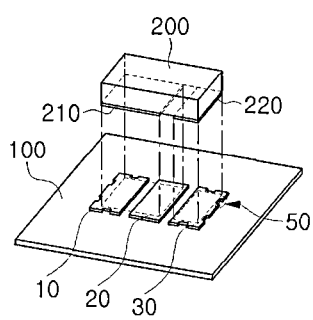

Unlike the description above, as shown in FIG. 10B, the respective first and second electrode units 210 and 220 provided with the electronic device 200 may have a linear form, and corresponding thereto, the first and second electrode pads 10 and 30 may have a rectangular shape and convex-concave part 50.

Figure 10C:
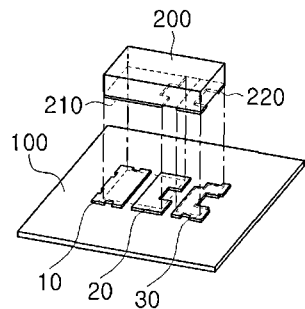

The first electrode unit 210 of the electronic device 200 shown in FIG. 10C may have a centrally recessed side portion facing the second electrode unit 220. In this case, the intermediate pad 20 may have a centrally recessed side portion facing the second electrode pad 30, such that the first electrode pad 10 and the intermediate pad 20 facing the first electrode unit 210 may have a shape corresponding to the first electrode unit 210.

Figure 10D:
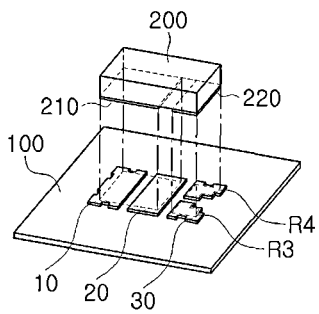

In addition, since a divided form of a pad facing an electrode unit is not limited to a shape of a first electrode unit, the second electrode pad 30 may include first and second regions R3 and R4 separated and spaced apart from each other as shown in FIG. 10D.

Figure 11A:
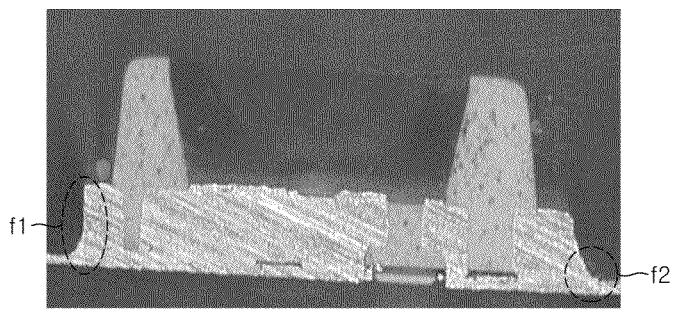
FIGS. 11A and 11B are images for comparing side portions of an electronic apparatus according to an embodiment to that of a comparative example.
Figure 11B:
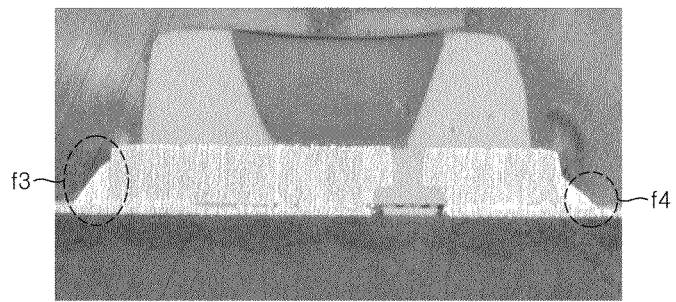

FIGS. 11A and 11B are images for comparing side portions of an electronic apparatus according to an embodiment to that of a comparative example.

In detail, FIG. 11A illustrates an embodiment in which a light emitting device package is mounted on a substrate having an upper surface on which first and second electrode pads are formed to be separated from each other. Here, the substrate does not include an intermediate pad, and the first and second electrode pads do not include a concave-convex part on an outer circumferential surface.

FIG. 11B illustrates an electronic apparatus according to the embodiment illustrated in FIG. 7A and here, as an electronic device, a light emitting device package is used. In detail, the electronic apparatus may include an electronic device disposed on the substrate including a first electrode pad, an intermediate pad and a second electrode pad formed to be separated from one another thereon, and the first and second electrode pads may be provided with a concave-convex part formed on an outer circumferential surface.

Comparing FIGS. 11A and 11B, it can be appreciated that in an electronic apparatus of FIG. 11A, a comparative example, a fillet is not formed between the substrate and the electronic device or the formation thereof is weakened (f1, f2). Meanwhile, with reference to FIG. 11B, it can be confirmed that in an electronic apparatus according to an embodiment of the present inventive concept, a fillet is smoothly formed between a substrate and an electronic device (f3, f4).

As set forth above, according to embodiments of the present inventive concept, an excellent solder fillet may be formed when electronic devices are mounted on a substrate through soldering or the like, and electronic apparatus reliability and stability may be realized.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. An electronic apparatus comprising:
a substrate including:
a first electrode pad, a second electrode pad and an intermediate pad each disposed on one surface of the substrate and separated from one another; and
an electronic device disposed on the substrate and including:
a first electrode unit and a second electrode unit, the first electrode unit including an electrode having an adhesion surface extending uninterrupted on the electronic device to face the first electrode pad and the intermediate pad, and the second electrode unit having an adhesion surface facing the second electrode pad.

2. The electronic apparatus of claim 1, wherein at least one of the first electrode pad and the second electrode pad further includes at least one concave-convex part disposed on an outer circumferential surface thereof.

3. The electronic apparatus of claim 2, wherein the concave-convex part is disposed in a surface adjacent to an outer side part of the electronic device on the outer circumferential surface.

4. The electronic apparatus of claim 1, wherein the intermediate pad is disposed between the first electrode pad and the second electrode pad.

5. The electronic apparatus of claim 1, wherein the first and second electrode pads are not entirely covered by the first and second electrode units, such that exposed regions thereof are provided, when the substrate having the electronic device disposed thereon is viewed from above.

6. The electronic apparatus of claim 1, wherein at least one of the first and second electrode pads has a shape at least partially corresponding to the adhesion surfaces of the first and second electrode units.

7. The electronic apparatus of claim 1, wherein the adhesion surface of the first electrode unit is larger than that of the second electrode unit.

8. The electronic apparatus of claim 7, wherein the sum of an area of the first electrode pad and an area of the intermediate pad is larger than an area of the second electrode pad.

9. The electronic apparatus of claim 1, further comprising:
at least one ledge part connecting the first electrode pad to the intermediate pad.

10. The electronic apparatus of claim 1, wherein a side part of an outer circumferential surface of the first electrode pad facing the intermediate pad has a linear form.

11. The electronic apparatus of claim 1, wherein at least one of the first and second electrode pads includes a shape centrally recessed from one side portion.

12. The electronic apparatus of claim 1, wherein the electronic device is a light emitting device package.

13. An electronic apparatus comprising:
a substrate including:
a first electrode pad and a second electrode pad disposed on one surface of the substrate and separated from each other; and
an electronic device disposed on the substrate and including:
first and second electrode units having adhesion surfaces facing the first electrode pad and the second electrode pad, respectively,
wherein at least one of the first and second electrode pads includes at least one concave-convex part formed on an outer circumferential surface thereof.

14. The electronic apparatus of claim 13, wherein the concave-convex part is disposed in a region adjacently to an outer side part of the electronic device on the outer circumferential surface.

15. The electronic apparatus of claim 13, wherein the first electrode pad includes first and second regions separated and spaced apart from each other.

* * * * *